United States Patent [19]

Du et al.

[11] Patent Number: 6,115,185
[45] Date of Patent: Sep. 5, 2000

[54] PROCESS AND DEVICE FOR FORMING AND GUIDING THE RADIATION FIELD OF ONE OR SEVERAL SOLID AND/OR SEMICONDUCTOR LASERS

[75] Inventors: Keming Du, Aachen; Peter Loosen, Kornelimünster, both of Germany

[73] Assignee: Fraunhofer-Gesellschaft zur Forderung der Angewandten Forschung E.V., Munich, Germany

[21] Appl. No.: 08/945,739

[22] PCT Filed: Mar. 23, 1996

[86] PCT No.: PCT/EP96/01286

§ 371 Date: Jan. 20, 1998

§ 102(e) Date: Jan. 20, 1998

[87] PCT Pub. No.: WO96/34441

PCT Pub. Date: Oct. 31, 1996

[30] Foreign Application Priority Data

Apr. 26, 1995 [DE] Germany ............... 195 14 625

[51] Int. Cl.[7] .................................................. G02B 27/10
[52] U.S. Cl. ...................................... 359/628; 359/627
[58] Field of Search ....................... 359/618, 619, 359/626, 627, 628, 639, 640, 641, 637; 385/39, 42, 43, 47

[56] References Cited

U.S. PATENT DOCUMENTS

| | | | |
|---|---|---|---|
| 4,725,131 | 2/1988 | Goodwin et al. | 385/46 |
| 4,986,634 | 1/1991 | Horikawa et al. | 359/618 |
| 5,148,326 | 9/1992 | Hohberg | 354/853 |
| 5,668,903 | 9/1997 | Neuberger et al. | 385/38 |
| 5,887,096 | 3/1999 | Du et al. | 385/39 |

FOREIGN PATENT DOCUMENTS

| | | |
|---|---|---|
| 40 23 904 A1 | of 1992 | Germany . |
| 4446026 | 3/1996 | Germany . |
| 9515510 | 6/1995 | WIPO . |
| 9613884 | 5/1996 | WIPO . |

OTHER PUBLICATIONS

Cleo–1994, Aug. 28, 1994–Sep. 2, 1994, Amsterdam pp. 410–411.
Optics Letters, vol. 20, No. 2, Jan. 15, 1995, Washington US. pp 222–224.
Patent Abstracts of Japan, Aug. 22, 1987 JP 62–65012 (A).
Patent Abstracts of Japan, Feb. 6, 1987 JP 61–212820 (A).

*Primary Examiner*—Georgia Epps
*Assistant Examiner*—Ricky Mack
*Attorney, Agent, or Firm*—Fulbright & Jaworski, LLP

[57] ABSTRACT

The present invention relates to a process and device for forming and guiding the radiation field of one or several solid and/or semiconductor lasers.

41 Claims, 13 Drawing Sheets

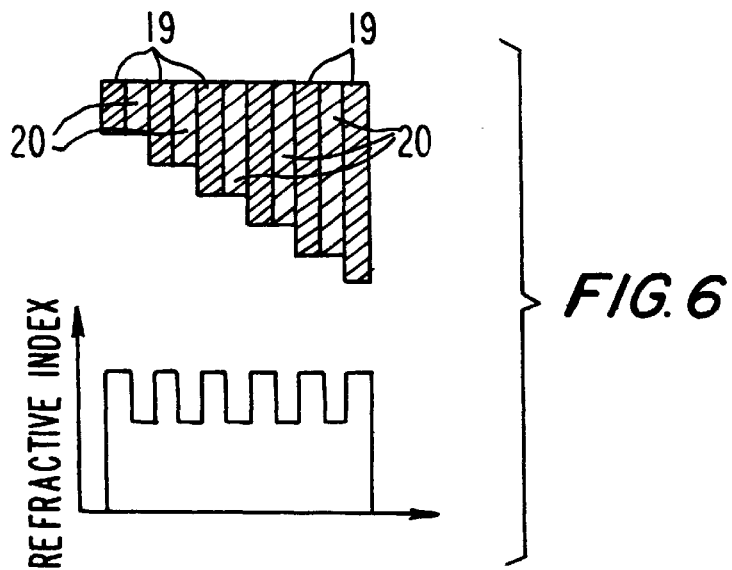
FIG. 6
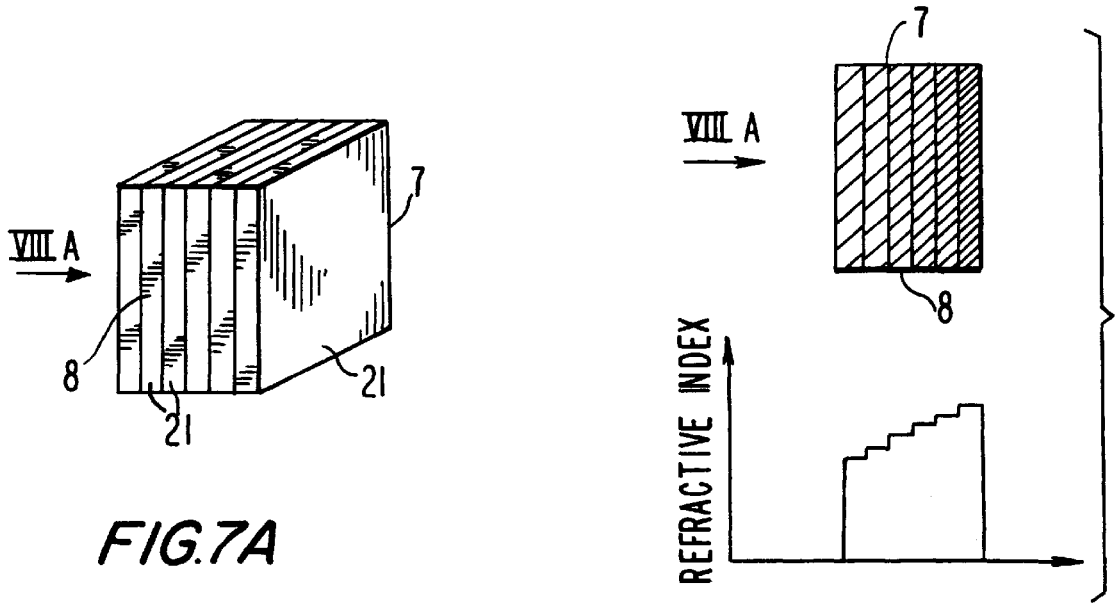
FIG. 7A
FIG. 7B

PROCESS AND DEVICE FOR FORMING AND GUIDING THE RADIATION FIELD OF ONE OR SEVERAL SOLID AND/OR SEMICONDUCTOR LASERS

BACKGROUND OF THE INVENTION

The present invention relates to a system for the formation and guidance of a radiation field of one or more solid or semiconductor lasers, especially a radiation field of an array or field arrangement of one or more solid lasers or semiconductor lasers, with a radiation transformation optic for producing a defined radiation field, wherein the optic has refractive elements. The invention furthermore relates to a method for forming and guiding a radiation field of one or more solid lasers or semiconductor lasers, especially a radiation field of an array or field arrangement of one or more solid and/or semiconductor lasers having a radiation transforming optic to produce a defined radiation field, the optic having refractive elements.

Solid and semiconductor lasers have found increasing use in the machining of materials and in medical technology.

One broad application of solid lasers is in the machining of materials. The range of the application of solid lasers is established by the required wavelength of the radiation, the power, and the shape of the lasers for the particular application. Since high beam qualities can be produced with solid lasers, especially in low-power classes, which in conjunction with short wavelengths and appropriate machining optics permit very small focal point diameters, applications of solid lasers are possible especially in the case of hard-to-machine and highly reflective materials, and in applications in which high machining precision is required. Another advantage to be mentioned is the great frequency bandwidths of solid lasers, in which many modes vibrate simultaneously, in contrast for example to gas lasers. An additional feature of a solid laser is its small size, typically about 8 cm long with a typical diameter of 1 cm. Applications of solid lasers in the field of metal machining include material ablation, boring, cutting, seaming and welding.

In recent years diode lasers have experienced rapid development. Typical applications are the machining of materials as well as the pumping of solid-state lasers.

High-power laser diodes typically possess active media with a cross section of 1 $\mu m \times 100$ $\mu m$. On account of the geometry of the active medium, the radiation which is yielded by the diode lasers is characterized by an elliptical beam cross section, great divergence in the narrow direction and relatively great divergence in the broad direction known as the junction plane. In order to achieve higher power densities with diode lasers it is common to combine several laser diodes into laser diode fields or arrays and focus their radiation. For the production of radiation fields, laser diodes, if they are arranged in a row, are disposed with the long axis of their elliptical beam cross sections running parallel to one another. Since the beam quality in the narrow direction is limited by diffraction and is about 1,000 times more limited by diffraction in the junction plane, the radiation emitted by a laser diode array cannot be focused to a small, circular spot with cylindrical optics and spherical optics or a combination thereof, which limits its application to, for example, the injection of the radiation into an optical fiber or to the so-called "end-on pumping" of solid lasers in conjunction with a laser diode array.

Even in the above-mentioned solid lasers, especially those of a low-power class using their high radiation qualities, it is also necessary, in order to produce expanded radiation fields with a high power density, to combine several such solid lasers into arrays or fields.

A problem which occurs in the case of large field arrays of solid lasers and diode lasers is the removal of the heat formed by lasing, which then requires appropriate cooling measures, so that spaces must be left between the individual solid lasers or active media, in order to provide heat sinks or build cooling channels for carrying cooling fluids. Such cooling of course greatly limits the pack density with which the lasers can be combined into laser arrays or fields.

For such radiation fields which are produced from arrays or field arrangements composed of diode lasers or solid lasers, since certain beam geometries and power densities are required in the imaging plane, i.e., on the workpiece surface for example, the radiation put out by each individual solid laser or diode laser must be appropriately guided and shaped.

On account of the extremely different beam qualities produced by such diode arrays in the two different directions, i.e., on account of the diffraction-limited beam quality in the narrow direction and the thousand times more diffraction-limited beam quality in the junction plane, the radiation emitted by a laser diode array cannot be focused with cylindrical optics and spherical optics or a combination of such optical components into a small, circular spot. Consequently at the present time the applications of high-power diode lasers are limited to areas where beam quality requirements are not strict. The expansion of the present-day applications to fields such as medical technology and machining, fiber optics and end-on pumping of solid and fiber lasers calls for the transformation of high-power diode laser radiation.

The same applies to the above-mentioned solid lasers of high beam quality whenever the large radiation fields that are required are to be produced from such individual solid lasers.

Setting out from the above-given state of the art and the problems described, the present invention is addressed to the problem of providing an apparatus and a process with which the radiation put out by diode and solid lasers, i.e., from diode laser or solid laser arrays composed of these lasers, or else the radiation that is put out by a laser, a diode bar for example (divided accordingly into radiation fractions), can be transformed by simple measures at moderate cost into radiation fields of any desired arrangement and power density distribution.

SUMMARY OF THE INVENTION

The above problem is solved in a system for the formation and guidance of a radiation field of the kind described above by grouping the radiation field into at least two fractions according to a plan, that each radiation group is aimed at a reflective element with a reflection surface, and the reflection surfaces are disposed in planes which have an offset from and/or a tilt to one another such that the radiation groups are radiated from the reflection surfaces to the reflective element with exit coordinates and/or exit propagation directions and/or exit orientations that are altered relative to one another from their relative lateral entry coordinates, that reflected radiation groups are grouped and each radiation group enters into a refractive element associated with it, while each refractive element refracts the radiation group at at least one of its surfaces such that the radiation groups exit from the refractive elements with lateral exit coordinates modified with respect to their relative lateral entry coordinates and/or with different exit propagation directions.

Setting out from a process of the kind described above, the above problem is solved according to the invention in that the radiation field is grouped into at least two radiation fractions according to a plan, that each radiation group formed is aimed against a reflective element with a reflective surface, while the radiation fractions are reflected by the reflection surfaces, which are disposed in planes and are staggered in directions such that they are offset in a first direction perpendicular to the propagation direction, that reflected radiation groups are grouped and each radiation group is radiated into a refractive element associated with it, while in each refractive element the radiation group is refracted at least at one of its surfaces such that the radiation groups exiting from the refractive elements issue in a second direction offset from one another in relation to the direction in which they entered.

With such an arrangement in its simplest embodiment, it is possible, with a minimum number of reflective elements and refractive elements, to image the radiation fractions in an image plane in the shape of any desired radiation field, with a high power transfer coefficient. With the described process and device it is for the first time possible, by means of simple reflective elements, using different angles of incidence of the individual radiation groups on the reflective element, to produce a defined stagger on the exit side, such that the particular radiation groups exit with coordinates and/or propagation directions and/or orientations that are different from one another. The radiation fractions reflected on the reflective elements are then regrouped and enter a refractive element associated each with one group. This grouping can be made different from the first grouping with which the individual radiation fractions enter the reflective elements, or else the original grouping can be retained, i.e., a refractive element is associated with each reflective element, and those radiation fractions can enter it which have also been transformed by the particular reflective element. In the particular refractive elements the particular radiation group is then refracted such that the radiation group exits from the refractive elements with coordinates and/or propagation directions that are different from their entry coordinates relative to one another. This means that, at the exit end of the refractive elements, the exiting radiation groups are propagated in their relative coordinates to one another with a component of direction different from the first reorientation. In other words, the radiation that is issued from a field arrangement composed of single lasers, with an elongation perpendicular to the radiation's direction of propagation, i.e., in the x-y direction, strikes the reflective elements such that the individual radiation groups are differently reflected, and at first an offset is achieved, after the first reflective element, in the one direction of propagation, i.e., in the y direction for example, which preferably is perpendicular to the greatest length of the radiation field. At the exit end of the reflective element the individual radiation groups are then side by side in this x direction and staggered in staircase fashion in the y direction. For example, while this grouping is maintained, the staggered radiation groups then pass each into a refractive element at a defined angle and/or direction which has a component of direction different from the direction of incidence on the first element, so that the individual radiation groups are refracted in the particular refractive elements such that, at the exit end, they have an offset different from the entry end and/or a different propagation direction, now in the x direction. This in turn signifies that the radiation fractions offset staircase-wise at the exit end of the refractive element are drawn together one over the other and form, for example, a continuous radiation field. It is apparent from this example that, with any desired number of solid lasers and/or semiconductor lasers, grouped together if desired, using one of the number of first (reflective) and second (refractive) elements corresponding to the number of the radiation groups, a reorientation and/or regrouping can be achieved of the radiation fractions in the two orientations perpendicular to the original propagation direction of the radiation field. In this case a high effective power, a compact construction using a minimum number of optical components and a great degree of freedom in the arrangement and reorientation of the radiation frictions are achieved.

Although the individual diode lasers and/or solid lasers, and thus their radiation cross sections, are a certain distance apart, by these measures not only a reorientation of the position of the individual radiation fields at the exit end of the second element, i.e., the refractive elements, can be achieved, but it is possible in a simple manner to place the individual radiation fields closer together and thus to increase the power density per unit area. It is evident that, for such reorientation and variation of the power density distribution, only a minimum number of optical components is necessary, resulting again in a compact design. Furthermore, with the relative position of the reflection surfaces of the reflective elements with respect to the individual solid lasers and/or semiconductor lasers, as well as the length of the reflective elements across the direction of propagation of the radiation, a grouping corresponding to the desired imaging and power density distribution can be undertaken. This means that, for example, the radiation of one or more lasers (single-beam source) of the field arrangement is radiated into the one and/or the other reflective element, i.e., even at the entry end of the reflective elements a grouping of the radiation fractions of the radiation field is performed. The device is suitable for field arrangements of solid lasers and/or semiconductor lasers, constructed and grouped together in any way, i.e., for linear field arrangements or arrays, or else, for example, for a field arrangement having a plurality of stacked linear laser arrays composed of a plurality of individual lasers (single radiation source) which produce a bidimensional radiation field perpendicular to the direction of propagation.

If it is necessary, additional imaging optics are used for the purpose of imaging onto the elements the radiation emitted by the individual radiation sources, also when they are grouped.

In an additional embodiment of the device, the individual reflection surfaces of the reflective elements have each a different separation from the beam exit surfaces of the lasers or of the laser group of the array associated with them whose radiation falls on them, the varying distance corresponding sequentially to the order of the grouping of the array; in this manner it is possible for the radiation fractions to have at the exit of the elements an approximately parallel direction of propagation.

In accordance with the selection of the separation between the individual beam exit surfaces of the individual radiation sources of the array or their grouping together, the space between the reflection surfaces as well as the offset of the reflection surfaces from one another is also chosen and adapted to the requirements.

Preferably, however, the centers of the irradiated reflection surface areas of the individual reflection surfaces on which the particular beams of the individual radiation sources fall, lie on a straight line, preferably with the same distances apart, i.e., these reflection surfaces then have the same offset from one another as well as a distance from the exit surfaces of the individual radiation sources which varies by the same amount.

A mirror of staircase-like design has proven advantageous as a simple reflective element by which the individual reflection surfaces can be formed and shaped. A staircase mirror of this kind can be in the form of a substrate provided with a mirror surface by deposition from a vapor, for example, although it is also possible to grind such a staircase pattern with diamond tools on a glass substrate, which will have the advantage that it will be extremely stable and free of distortion. Also, the reflective elements as described above can be applied to supports of plastic, which are simple to make. Plastic supports of such configuration, which can be made by injection molding methods, result in very economical devices.

The device according to the invention has furthermore the advantage that the reflection surfaces can be formed by planar mirror elements, which are also very simple to make. The individual reflection surfaces, however, can also be concave or convex surfaces in order to widen or to focus the beam cross sections of the radiation fractions of which the radiation field is composed. Curvatures in the form of sectors of a cylinder are to be preferred in order, for example, to achieve focusing in only one direction.

In order to achieve a staggered configuration at the exit end of a refractive element, one simple method is to associate propagation paths of different length with the refractive elements. This can be accomplished by arranging different angles of incidence of a particular group of beams on the refractive element associated with them, or else the refractive elements can have different lengths so as to lengthen the travel of the beams through the element and thus increase the offset at the exit end.

In order, for example, to produce a radiation field composed of equal radiation groups, such as for example one in which one radiation group corresponds to the radiation emitted by one or two laser sources so as to achieve a uniform, graded reorientation, the refractive elements being of such size and aligned relatively with their entry surfaces with the direction of propagation of the particular radiation group, that directly adjacent radiation groups have equal differences in the lengths of their propagation paths. In this manner an equal offset from one radiation group to another radiation group is achieved at the exit end of the refractive element. In order to obtain such a uniform offset from one refractive element to another refractive element, the exit surfaces of the refractive elements are offset staircase-wise from one another, which in turn means the individual refractive elements have a different length in the direction of beam propagation. Furthermore, it may be advantageous for producing a uniform offset of the radiation groups from one another to arrange the exit and/or entry surfaces of the refractive elements so that they lie in a plane running parallel to one another. Preferably, however, the entry surfaces of the refractive elements, which are associated with the radiation groups are aligned lying in one plane and the staircase-like offset is formed at the exit end of the refractive elements, since the divergence angle due to the refraction within the refractive elements is then smaller and thus the grouping can be achieved more definitely, in contrast to the case in which the offset lies at the entry end.

Another simple way to achieve the desired offset on the basis of the different refraction of the individual radiation groups in the refractive elements is to equip at least a part of the refractive elements with different refractive indices, for example by using a different kind of glass body for the refractive element, or by a different doping of a glass body, preferably one of quartz glass, which is characterized by its very high purity, as a means of increasing the refractive index or decreasing it. A uniform grading for the production of a uniform offset of adjacent radiation groups can be advantageous if adjacent refractive elements have different refractive indices which preferably increase or decrease in the same ratios.

To prevent radiation fractions of a refractive element from entering adjacent refractive elements, such adjacent elements are separated from one another by a layer which has a lower refractive index than the adjacent refractive element. Radiation fractions in a refractive element, which arrive at the marginal zone of the refractive element due to the angle of divergence of the radiation are then reflected to the center of the refractive element by total reflection.

As already stated above, the use of the refractive elements for varying the coordinates of the entering radiation groups to one another and/or for changing the directions of propagation offers a very simple possibility for achieving the desired radiation fields and power densities. In order to give a directional component in addition to that of the radiation exiting from a refractive element, refractive elements are advantageous in which the entry and/or the exit surfaces stand vertically on a common plane, but are rotated away from one another about axes which run in the plane of these surfaces and parallel to one another. By this different alignment of the entry and/or exit surfaces, preferably in a direction perpendicular to the direction in which the radiation is refracted, the direction of propagation of the individual radiation groups with respect to one another is changed, and thus their coordinates are changed. Furthermore, the possibility exists of curving these surfaces slightly, concavely or convexly, in order to fan out or focus the particular radiation of the radiation groups. Another simple possibility for widening a radiation field in one direction is provided if the entry and/or exit surfaces of the refractive elements stand vertically on a common plane and are rotated from one another in the plane of these surfaces and parallel to one another. Such measures can be taken both in the case of the first refractive elements, and also in the case of the second refractive elements, while of course this measure is applied to the second refractive elements, and indeed again preferably to the radiation exit surfaces.

As already explained above, a basic disadvantage of a field arrangement or array of individual solid lasers and/or diode lasers is their low fill factor. The term, "fill factor," is to be understood, in the case of an exit plane, for example, as the sum of the cross-sectional areas of the individual laser beams with respect to the total area which is excited by the exit window of the field arrangement. In many applications it is desired to achieve a very uniform fill factor, i.e., the area irradiated by the laser beam is to be irradiated with uniform intensity in all surface areas, in which case a measure is to be taken to the effect that, whenever the cross-sectional dimensions of the radiation fractions of individual radiation groups are less than the width of the associated refractive or reflective element, the particular radiation group enters the entry surface of the particular refractive element or reflective element at an angle of incidence other than zero degrees, such that approximately the entire width of the entry surface of the refractive element or the reflection surface of the reflective element is illuminated. This measure is taken preferably in the case of refractive elements when the entire refractive element is formed by a single, coherent body.

In order to produce either uniform radiation fields with a relatively great area, or to obtain a small radiation spot of high density in the working plane, a plurality of strip-shaped radiation fields composed of individual lasers are aligned parallel to one another so that the exit radiation is given by a laser field arrangement which is composed of a given number of linear laser arrays, each linear laser array being composed of a number of single lasers.

Within the scope of the radiation transformation according to the invention, an effort is made so that, after the last transforming element, if it is necessary, transformations can be made by means of more than two elements [in] which the radiation groups exiting or reflected from the last element have parallel propagation directions or a common intersection.

Both the reflective elements and the refractive elements have their specific advantages. Reflective elements are characterized by the fact that only one surface element is necessary in order to achieve the desired transformation. They are inexpensive to manufacture. They can furthermore withstand heavy loads. Refractive elements are characterized by the fact that only one body is necessary for achieving a required offset between the entry and exit surface. Furthermore, in refractive elements the orientation of the exit surface can be chosen so that an additional offset of the exiting radiation fractions is achieved at these exit surfaces. Furthermore, with refractive elements high coverage densities are possible with a defined association of the individual reflective elements with the particular radiation fractions. Moreover, such refractive elements can be so designed and arranged that the radiation fractions all enter the entry surfaces with equal divergence angles, so that approximately equal conditions are achieved. Lastly, an advantage is to be seen in the fact that the radiation is guided in the refractive elements and is thus subject to no external disturbing influences in this range.

In order better to explain the advantages obtained according to the individual claims, and to point out further advantages of the invention, a number of embodiments of the invention will now be described with the aid of the drawings, wherein:

BRIEF DESCRIPTION OF THE FIGURES

FIG. 6 shows a stack of refractive elements in the form of individual glass plates, while in the graph below it the refractive index is plotted across the row of the glass plates.

FIGS. 7A and 7B show refractive elements which are formed by individual glass plates, wherein each glass plate has a different refractive index.

DETAILED DESCRIPTION AND PREFERRED EMBODIMENTS

The device according to the invention in the various possible embodiments is appropriate for the formation and guidance of a radiation field of an array or field arrangement which is composed of a plurality of solid and/or semiconductor lasers. It is, however, also suitable for forming a radiation field which is put out by a single laser, as for example for the radiation of a diode bar with an elongated radiation field which is to be rearranged or transformed.

Since individual laser sources in the form of solid and diode lasers are scalable to higher powers to only a limited extent, a larger number of individual laser beam sources are combined in different arrays or field arrangements to achieve higher laser powers and power densities. A number of these field arrangements are represented in FIGS. 1A to 1E.

Figure 1A:
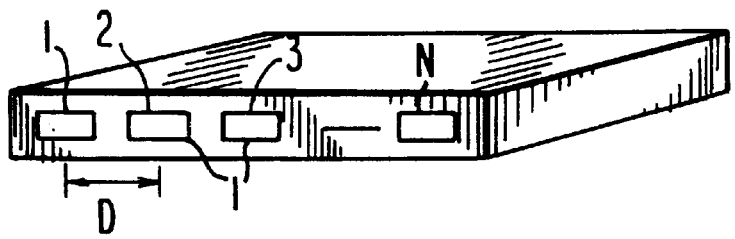
FIGS. 1A to 1E show schematically a variety of unidimensional and bidimensional laser arrays, in connection with which the apparatus according to the invention can be used.
Figure 1B:
Figure 1C:
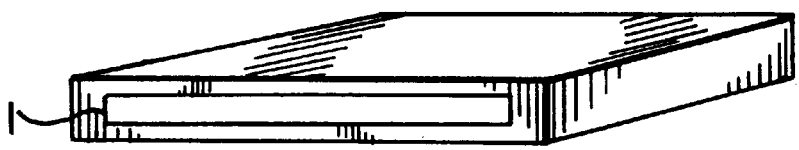
Figure 1D:
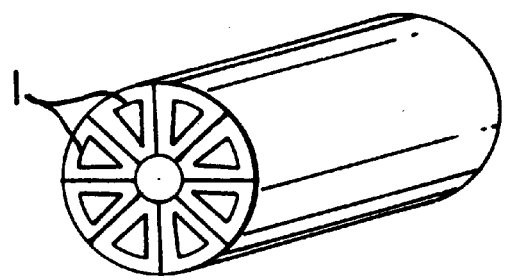
Figure 1E:
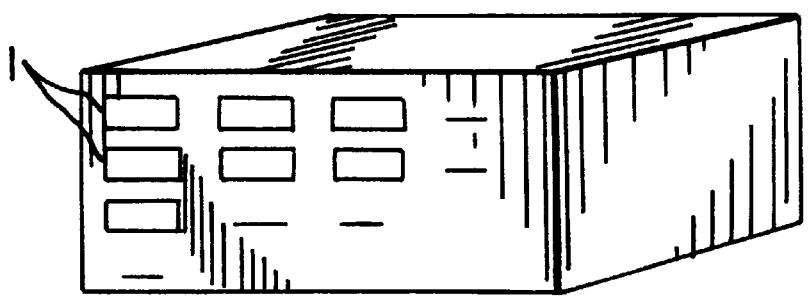

Here it is possible to distinguish linear field arrangements such as those represented in FIGS. 1A and 1C, as represented by way of example in FIG. 1B, radial field arrangements as represented schematically in FIG. 1D, as well as bidimensional arrays as represented schematically in FIG. 1E.

A linear array, such as represented in FIG. 1A, has n individual beam sources, so that an elongated, linear beam distribution results. The linear geometry is disadvantageous in cases wherein circular or quadratic radiation surfaces are to be achieved with a high fill factor in an image or working plane.

The term, "fill factor," as used in this description, is to be understood as the ratio of the cross-sectional area of the individual radiation sources, provided with the reference number 1 in FIGS. 1, to the total area that is excited by the individual beam sources 1.

A disadvantage of a linear array according to FIG. 1A made up of individual radiation sources is that in the longitudinal direction the beam quality is reduced by at least a factor N with respect to the individual radiation source. In a unidimensional, linear arrangement, therefore, there is a certain asymmetry of the emission of the radiation field as regards the cross-sectional geometry and the beam quality, which increases to the extent that the effort is made to increase the number of individual radiation sources and thus the total power. Bidimensional arrays corresponding to FIG. 1B, or especially arrays that are composed of more than two linear single arrays, as is represented in FIG. 1E, have the disadvantage of poor accessibility of the inner individual radiation sources in order, for example, to cool them (diode lasers) or excite them (solid lasers). In order to provide cooling and the measures necessary for excitation, the distances D (see FIG. 1A) of the individual radiation sources from one another must be increased, thereby of course reducing the fill factor at the locus of the radiation emission.

Another possibility for increasing the fill factor is afforded by an arrangement which is represented in FIG. 1D. The individual sources 1 have a circular emission cross section arranged about a central axis.

As shown by FIGS. 1A to 1E, to obtain high radiation power and high radiation densities it is not sufficient to increase the number of single radiation sources, since even a multidimensional arrangement of single radiation sources has its limits. Larger field arrangements make it necessary, for example, to provide greater distances d between the single radiation sources in order to supply the inner radiation sources accordingly.

In order to be as independent as possible in arranging the individual radiation sources it is therefore necessary to modify the radiation of the individual sources 1 by means of secondary optical arrangements in their coordinates relative to one another and/or in the direction of propagation of the single beams relative to one another and/or in the orientation of the individual beam such that, in a given structure of a field array of several solid and/or semiconductor lasers, definite radiation fields can be produced in a single image plane.

Figure 2A:
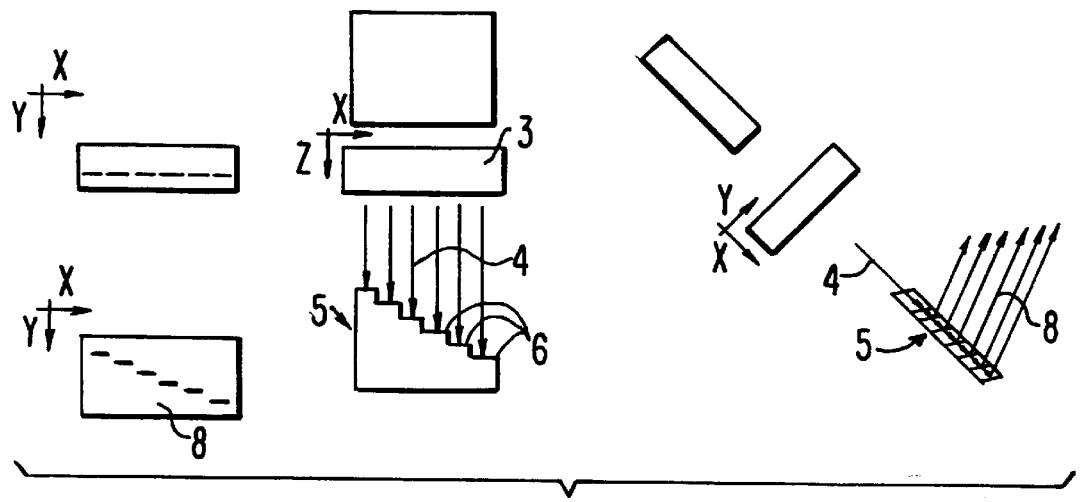
FIGS. 2A and 2B show a first embodiment of the system according to the invention for the formation and guidance of a radiation field of a unidimensional, rectilinear laser array which is represented in FIGS. 1A or 1B, using a reflective element (FIG. 2A) and a secondary refractive element (FIG. 2B).
Figure 2B:
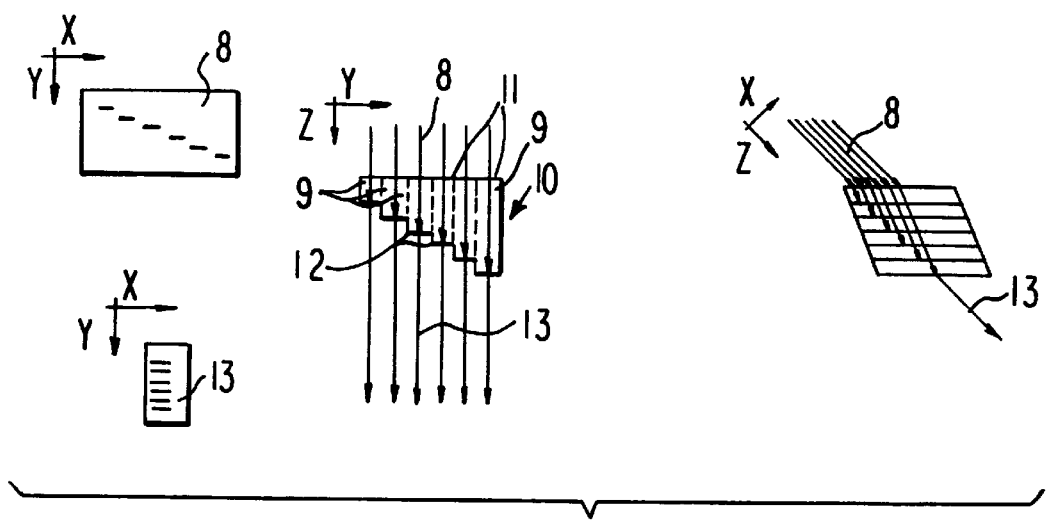

According to a first embodiment of the invention, which is shown in FIGS. 2A and 2B, the radiation 4 issuing from a solid or semiconductor laser field array 1, which is a linear array of six individual radiation sources 1, as is represented enlarged also in FIG. 1A, is aimed at a first element 5 which is constructed of individual reflective elements or reflective surfaces 6 in the form of a staircase mirror. The individual beams 4 are reflected at the individual reflecting surfaces 6 of the first element or staircase mirror 5. The angle of incidence on the reflecting surfaces 6 and the step height, i.e., the lateral offset of the individual reflecting surfaces 6 from one another, as well as, in some cases, the distance between the reflecting surfaces 6 and the exit plane 7 of the laser field 3 are so coordinated that the reflected beam groups 8, as shown in the bottom left of FIG. 2A, are offset from one another in a staircase-like manner.

The beam groups 8 reflected by the reflective elements 6 can then be regrouped, although this is not shown in the figures, and depending on the specifications, each beam group 8 is directed to an associated refractive element 9 of a second element 10. In the embodiment represented in FIG. 2A the second element 10 is composed of six single refractive elements 9, as indicated by the broken lines. As it can be seen in the right-hand side of FIG. 2A, the individual radiation members 8 fall upon the end entry surfaces 11 of the refractive elements 9 with an angle of incidence that is other than 0°, so that they are refracted inside of the refractive elements 9. Since the individual refractive elements 9 have the same index of refraction or are made of an identical transparent substance, the individual rays 8 receive an identical angle of refraction at the radiation entry surfaces 11 of the refractive elements 9. The different length of the individual refractive elements 9 bring it about that the individual beam fractions 8 cover a path of different length through the refractive element 9, so that they issue from the radiation exit surface 12 at different levels in comparison with the relative position on the radiation entry surface 11, as represented on the bottom left in FIG. 2A. On account of the equal staircase-like offset of the radiation cross sections from one another at the radiation entry surface 11, an equal offset of the radiation cross sections from one another occurs at the radiation exit surface 12. On account of the staircasing of the refractive element 9 of the second element 10 opposite to the staircasing of the reflective elements 6 of the first element 5 from the one outer radiation fraction to the other outer radiation fraction, the overall propagation paths of the particular radiation fractions are made approximately equally long and can be imaged in a common plane.

The refraction occurs at the refractive elements 9 on the basis of the angle of incidence of the individual exit beams 8 on the radiation entry surfaces 11 in a direction that is turned 90° from the direction of incidence of the individual radiation fractions 4 on the first element 5. In this manner the individual radiation fractions 8 are refracted such that the exit beams 13 issuing from the radiation exit surfaces 12 of the second element 10 are offset; thus the individual radiation cross sections are stacked one on the other as can be seen at the bottom left of FIG. 2B. The magnitude of the offset of the exit beams 13 at the exit surface 12 can be established on the one hand according to the indices of refraction of the refractive elements 9 and on the other hand by the distance the radiation fraction 8 travels through the refractive element 9 associated with it. As shown in FIGS. 2A and 2B, the two elements 5 and 10 and their reflective elements 6 and their refractive elements 9 cause the radiation fractions to be transformed twice, so that on the one hand they are offset differently by the reflective elements 6 in the one direction perpendicular to the direction of propagation, while they are again stacked by the refractive elements 9 in the direction that is both perpendicular to the direction of propagation of the beam fractions 8 and perpendicular to the first direction of diffraction, so that the radiation cross sections starting out from a linear array can be brought together into a dense radiation field of high radiation intensity. On the basis of the principle as represented in FIGS. 2A and 2B, other beam geometries issuing from a linear array can be formed.

The system of FIGS. 2A and 2B has a special advantage in the shaping and guidance of a radiation field which is composed of diode lasers. Typically, diodes are integrated in a linear field array of 24 individual diode lasers over a length of 1 cm. Such a laser diode field array with a beam cross section of 1 μm×10 mm has extremely different beam qualities in the two different directions of its elliptical beam cross section. Thus, the beam quality in the narrow direction, i.e., in the junction plane, is about 1000 times more refraction limited. Precisely in conjunction with such a laser diode field array, in which then, as in FIG. 2A, one reflective element and one refractive element is associated with each emitter, lateral offsets are produced in the first element 5 between the emitters in the y direction. The angle of incidence and the offsets are then so coordinated that the offset between the adjacent strip emitters becomes slightly greater than the beam dimension in the y direction. The second element 10 then produces offsets with appropriate selection of the direction of the incidence of the beam on the radiation entry surfaces 11, and by appropriate selection of the spread length in the refractive elements 9 in the x direction (slow direction) and by appropriate selection of the factors that can be influenced, the beam fractions are arranged together in the y direction. The beam quality along the y axis is then reduced by a factor of the number of emitters (6 in the illustrated example) and at the same time the beam quality in the slow direction (x direction) increases by the same factor. Thus the beam qualities in the two directions become comparable and the total radiation of the diode laser field array can be focused in a circular or rectangular spot.

At this point it is to be remarked that, in the individual figures of the various embodiments, identical or comparable components are given the same reference number. Repetitive description of these parts is not given, so that the description of these parts in connection with the one embodiment is to be applied analogously to the other embodiment.

Figure 3:
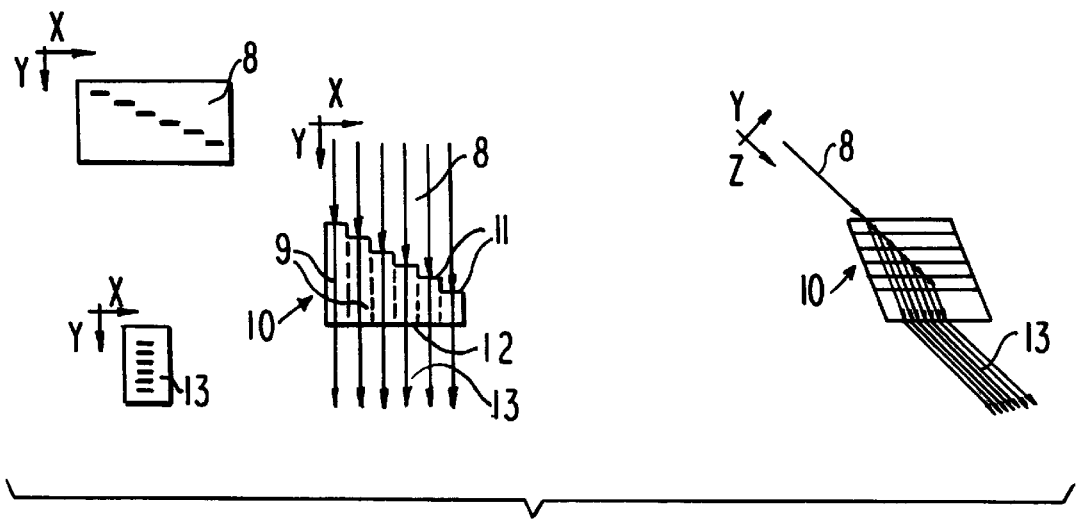
FIG. 3 shows an embodiment of a refractive element that is a modification of the refractive element of FIG. 2B.

In FIG. 3 there is shown an apparatus which is comparable to that of FIG. 2B. In this embodiment of FIG. 3 the element 10 is so oriented that the beam exit surfaces 12 are all in one plane, while the beam entry surfaces 11 are arrayed in a staircase manner. On account of the different distances traversed by the individual beans through the refractive element 9 associated with each, a staggering results, so that a radiation field 13 is produced as in FIG. 2B, as represented at the bottom left of the figure. Preference is to be given to the embodiment of the second element 10 of FIGS. 2B over the embodiment in FIG. 3, since the common plane in which the beam entry surfaces 11 lie permits a more precise grouping.

From FIGS. 2 and 3 it can be seen that, depending on which radiation patterns are to be produced from the individual radiation cross sections, the stair steps can also be spaced in a different manner, for example so that, say, the refractive elements 9 of the second element 10 that have the greatest length in the beam direction are disposed in the center of element 10.

The refractive elements 9 of the second element 10 are preferably made from a single glass body; another alternative embodiment, which is described further below, consists in composing the individual refractive elements 10 of glass plates.

Figure 4:
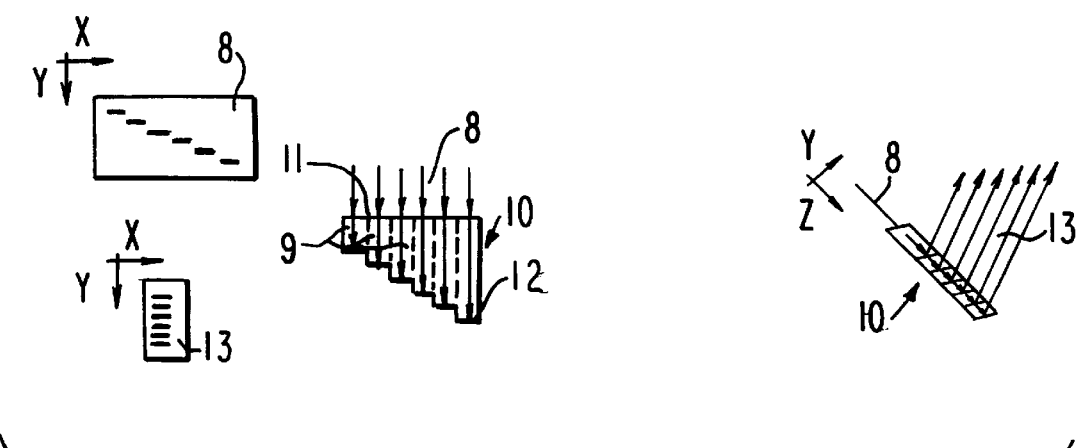
FIG. 4 shows an embodiment similar to that of FIGS. 2B, having additional reflective surfaces at the exit side of the refractive elements.

In FIG. 4 there is shown an embodiment of refractive elements 9 corresponding to FIG. 2B; in contrast to the embodiment in FIG. 2B, in this embodiment of FIG. 4 the beam exit surfaces are silvered. As a result, the radiation fractions 8 propagating in the individual refractive elements 9 impinge upon these mirror surfaces and, depending on the angle at which they strike these surfaces, they are reflected so that they emerge laterally from the element 10, as is shown in the right-hand part of FIG. 2B. While in FIG. 4 these reflective end surfaces 12 are represented such that they run parallel to the entry surfaces 11, the direction of propagation of the radiation fractions 8 reflected at the end surfaces can be given an additional, modified directional component by a modified angular position of these surfaces. In this manner the entering radiation 8 can be transformed, for one thing, by the propagation direction of various length into the refractive elements 9 in one direction, while it can be transformed by the end mirror surfaces 12 with an additional, different directional component.

Figure 5A:
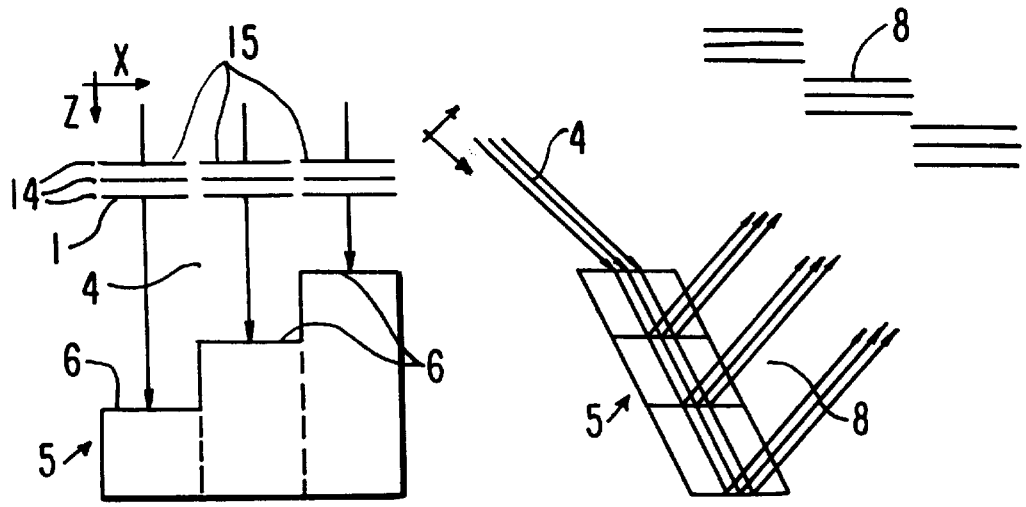
FIGS. 5A and 5B show an arrangement with reflective elements (FIG. 5A) and secondary refractive elements (FIG. 5B), wherein a field arrangement of three rows, each with three individual lasers, is associated with the three elements in question.
Figure 5B:
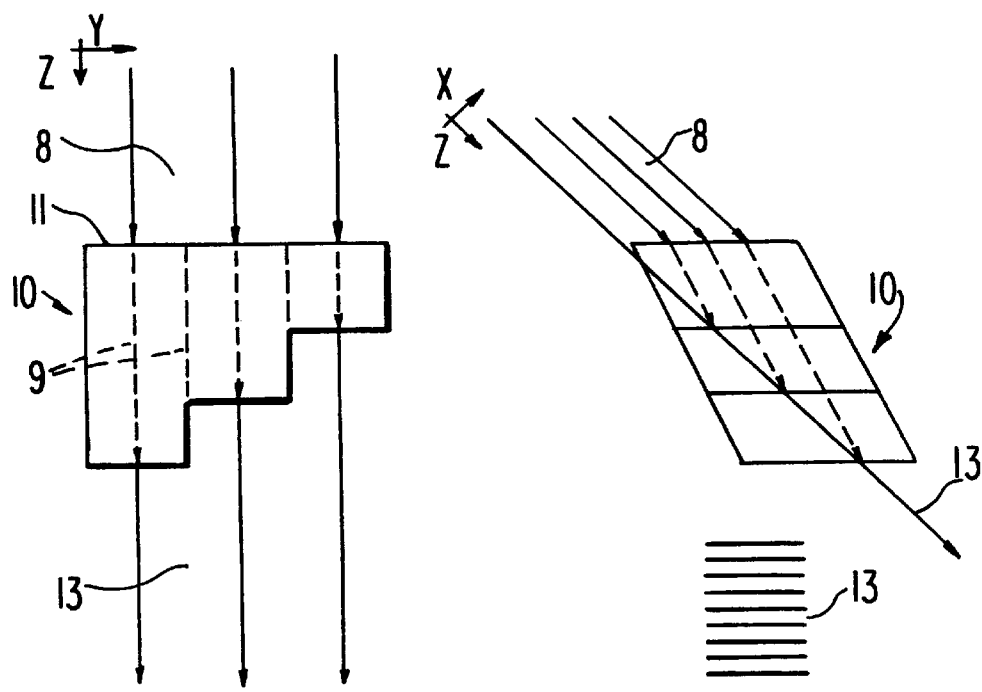

While different embodiments have been represented above in FIGS. 2 to 4, in which the radiation fractions of a linear field array of individual radiation sources have been explained, in FIGS. 5A and 5B there is shown an embodiment having a first and a second element 5, 10, with three reflective surfaces 6 (reflective element 6) and three refractive elements 9 (second element 10), into which enter the radiation fractions 4 of three linear field arrays 14 each having three individual radiation sources 15. The radiation of the individual radiation sources 15 of this field array is grouped with respect to the first element such that each of the individual radiation sources 15 stacked one on the other in direction z of each linear field array 14 running in direction x is associated with a reflective element 6, and thus they fall in three radiation groups upon the reflective elements 6. These radiation groups are reflected at the individual reflective elements 6, so that, due to the different distances they travel to the three reflective elements 6, they are given a staircase-like stagger. The individual radiation groups pass with this stagger into the refractive elements 9 which are represented in FIG. 5B, such that the radiation is refracted in a direction perpendicular to the first direction of reflection, so that at the exit end of the refractive elements 9 the three radiation groups and thus the nine single beam fractions are stacked together, as indicated by the pattern of the rays at the bottom left [right!] of FIG. 5B.

As for the radiation fields produced in each case it is to be understood that, in order to indicate the changes of the direction of propagation of the beams, the individual radiation cross sections are represented spaced apart from one another; of course, the beams can be brought together so as to produce a coherent radiation field in the desired imaging plane.

In FIG. 6 an alternative embodiment of the second element 10 of FIGS. 2B and 5B is represented schematically, and is made up of individual glass plates 19 (refractive elements). Adjacent glass plates 19 are separated from one another by an additional glass plate 20 which has a lower refractive index than the glass plates 19. If the individual radiation fractions enter the glass plates 19 with the higher refractive index, they are transmitted and shaped therein in the manner of a waveguide. This is advantageous especially in laser field arrays, preferably for diode laser field arrays which have a low occupation density or lower fill factor, because in this manner a refractive element can be associated precisely with each single diode laser, and because loss of beam quality due to the fill factor can be largely avoided.

Figure 8A:
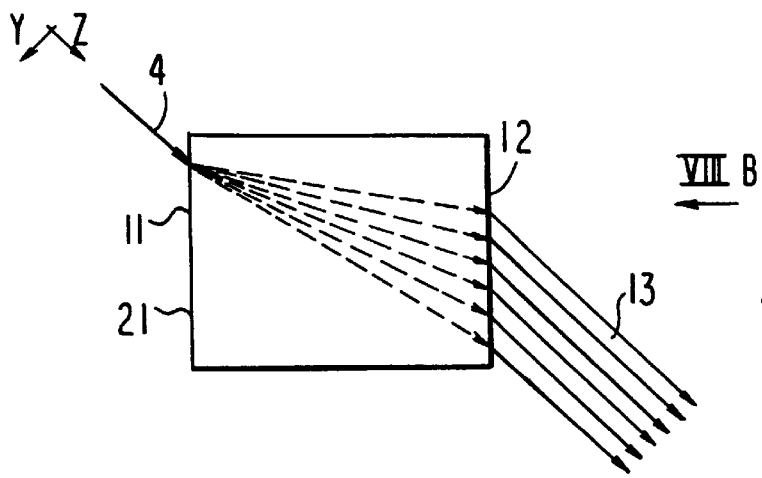
FIG. 8A is a view of the arrangement of FIGS. 7A and 7B seen from the direction of the arrow VIIIA in FIGS. 7A and 7B.
Figure 8B:
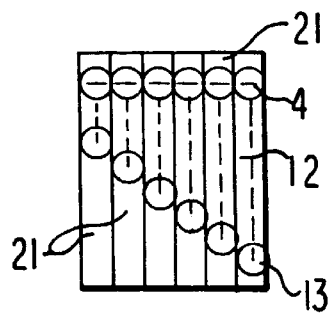
FIG. 8B is a top plan view of the arrangements of FIG. 8A from the direction of the view arrow VIIIB in FIG. 8A.

FIGS. 7A and 7B show a device composed of individual glass plates 21 which have the same external dimensions. As it can be seen in FIG. 7B, the individual glass plates 21 have different refractive indexes, the refractive index of the left plate being the lowest, while the refractive index of the right, outside plate 21 is highest. The refractive indexes are increased in approximately equal steps between the single glass plates 21, as shown by the diagram in FIG. 7B. In use, each glass plate 21 is associated as a refractive element with one radiation group of a radiation field. Each radiation group falls at an angle upon the particular radiation entry surface 11, these surfaces being the edge surfaces of the glass plates 21, so that the partial beams are differently refracted according to the refractive index. This different refraction within the glass plate 21 is represented in FIG. 8A or 8B. With the arrangement of the individual glass plates according to FIGS. 7 and 8, there is produced at the radiation exit surface 12 a staggered beam pattern as seen in FIGS. 8A and 8B.

Figure 9A:
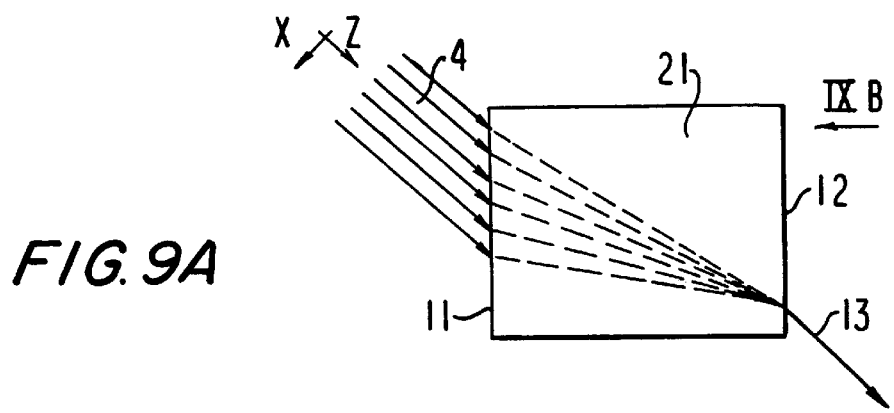
FIGS. 9A and 9B are representations corresponding to FIGS. 8A and 8B, wherein, in contrast to FIGS. 8, the individual beams of the groups enter the refractive element at different levels and emerge from the refractive element at the same level.
Figure 9B:
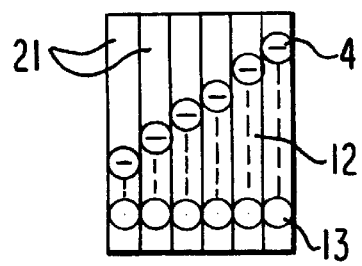

In FIGS. 9A and 9B an arrangement of glass plates 21 corresponding to FIGS. 7 and 8A is shown in a side view. In this embodiment the entering beam 13 is staggered from one glass plate 21 to the next, and then, due to the gradated indexes of refraction, the exiting beams are at the same level, as is indicated also in FIG. 9B. FIG. 9A can provide additional information as a supplement to FIG. 8A.

Figure 10:
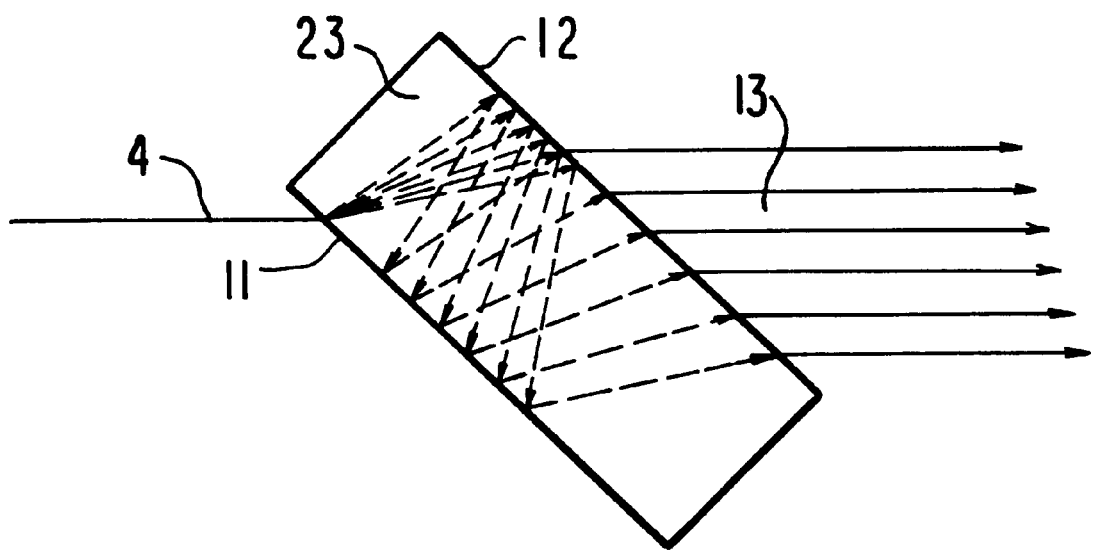
FIG. 10 shows schematically a lateral view of a system in which the individual groups of beams are folded repeatedly in a stack of glass plates corresponding to FIG. 7A.

In FIG. 10 there is shown an embodiment in a side view of another stack of glass plates, which is composed of individual glass bodies 23 with various refractive indexes. The radiation 4 falling upon a lateral surface 11 of the individual glass body 23 is repeatedly folded and exits from the exit surfaces 12 opposite the entry surfaces 11 with the stagger due to the different refractive indexes of the glass bodies 23. The two faces 11 and 12 can be suitably coated for reflection and transmission. By this repeated folding, the paths of propagation within the glass body 23 are lengthened, and thus the offsets of the issuing radiation fractions 13 from one another are increased despite the small size of the glass bodies 23.

Figure 11A:
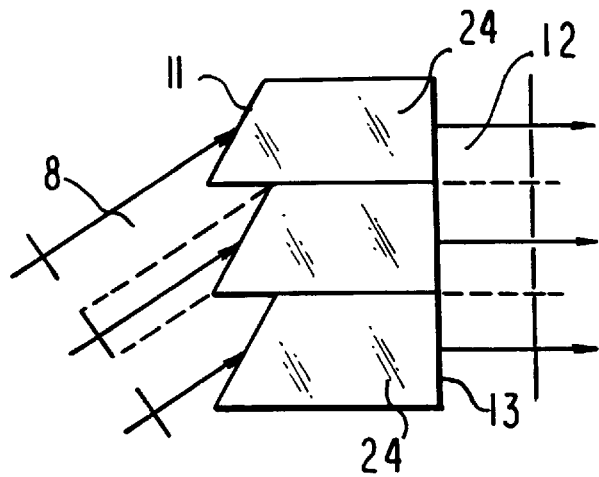
FIG. 11A shows an arrangement according to the invention which serves to increase the illumination density or fill factor.
Figure 11B:
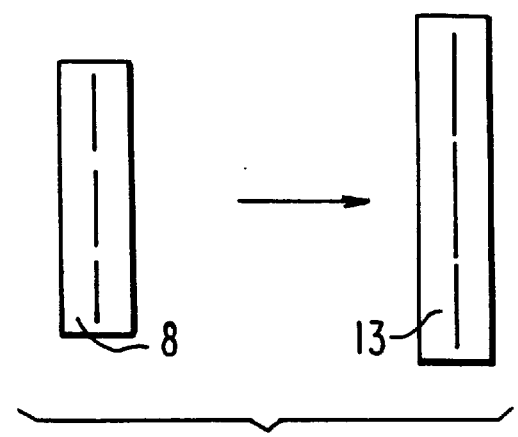
FIG. 11B shows schematically the cross-sectional distribution of the radiation field on the entry side and exit side of FIG. 11A.

If one considers field arrangements composed of diode laser arrays, in the form, for example, represented in FIGS. 1B and 1E, the fill factor amounts, due to heat, to about 30% to 50% of the surfaces excited by the individual beam sources. This, as already explained, reduces the beam quality compared with a theoretical case of an occupied density of 100%. To increase the fill factor and thus sustain a high beam quality, an arrangement of the refractive elements 24 is advantageous, which is represented in FIG. 11A. In this schematic example, three refractive elements 24 are stacked. In contrast to the embodiments previously described (planar refractive elements) the surfaces of entry 11 are canted. The individual radiation fractions 8 entering them are at such an angle to the radiation entry surfaces 11 that, despite the smaller size of the radiation fractions 8 across their direction of propagation, the entire radiation entry surface 11 of a particular refractive element 24 is illuminated, as indicated by the middle refractive element 24 in FIG. 11A. In this manner a higher fill factor is produced on the side of the radiation exit surface 12, as shown more clearly in FIG. 11B. A similar system with reflective elements is represented schematically in FIG. 12. In this example the radiation fractions 4 fall at an angle on reflective surfaces 25 of a staircase mirror 26, as is indicated by the slanting lines 27 at the entering radiation fractions 4, such that, compared with the width of the particular radiation fractions, a greater area of the reflective surfaces 25 is irradiated; In this manner the relative coordinates of the individual radiation fractions 8 are altered on the exit side such that they have a fill factor of approximately 100%, as is indicated by the solid line 28 on the end of the exit beams 8. A measure of this kind can be increased, for example, in the embodiment represented in FIG. 2A, in the first element 5, in order to increase the fill factor of the beams reflected by the mirror surfaces above that of the entry beams.

Figure 12:
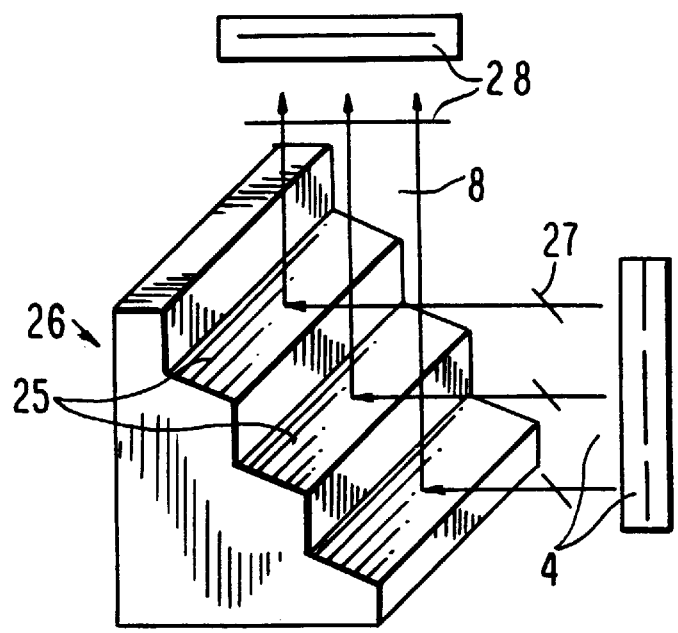
FIG. 12 is a perspective view of a staircase mirror arrangement for increasing the fill factor.

While the increase of the fill factor is represented only schematically in FIGS. 11 and 12, by the appropriate selection of the direction in which the radiation fractions impinge upon the entry surfaces with respect to refractive elements, and by appropriate selection of the position of the reflective surfaces 25 according to FIG. 12, the offset of the emerging radiation fractions can be varied with respect to the entering radiation fractions such that a desired transformation will occur, as explained above with the aid of FIGS. 2 to 5.

Since high power densities are required in certain applications, especially in connection with diode lasers, and for this purpose a plurality of linear diode laser field arrangements are stacked one on the other in the fast direction, the above measures can repeatedly be taken in the fast direction in such cases to increase the fill factor.

Figure 13:
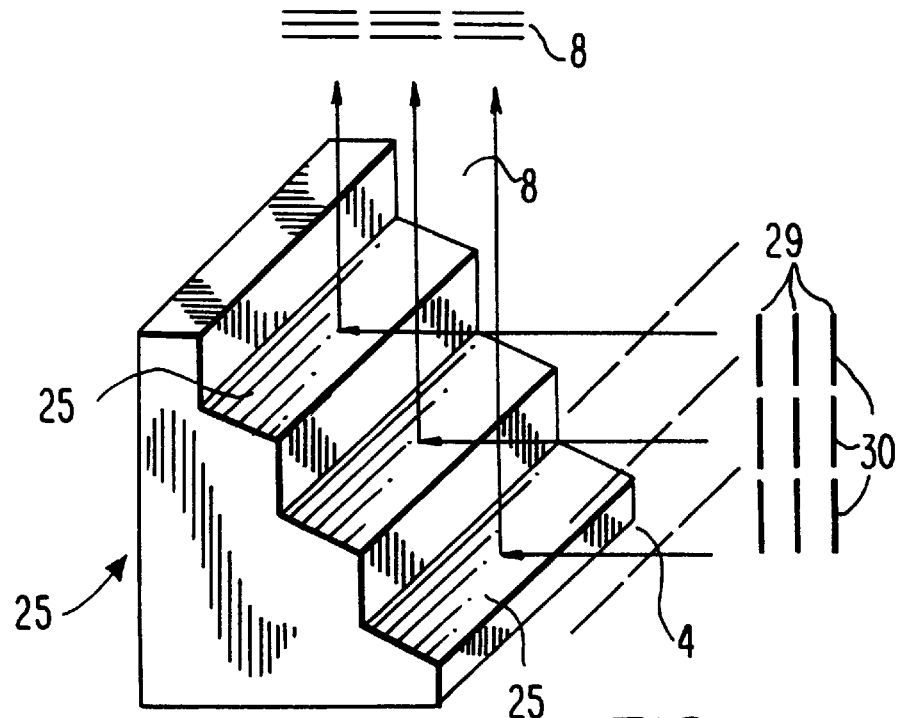
FIG. 13 shows the arrangement of FIG. 13 wherein a linear laser array is associated with each staircase mirror of a linear laser array.

In FIG. 13 there is shown a schematic structure of a reflective element or staircase mirror 26 with three reflective surfaces 25 (corresponding to FIG. 12). In this case, in contrast to the embodiment represented for example in FIG. 12, a linear field arrangement 29 is associated with each single reflective surface 25, each linear field arrangement in this schematic representation being composed of three individual beam sources 30, diode lasers for example. The radiation fractions of each linear field arrangement 29 fall each upon a reflective surface 25 of the staircase mirror 26 at a preselected angle of incidence, so that, due to the inclination of the mirror surfaces with respect to the angle of incidence, on the exit side the individual linear field arrangements 29 are drawn closer together, as it will appear from a comparison of the radiation fields 4 and 8 on the entry and exit sides of the staircase mirror 26. By this simple measure the fill factor, in the embodiment represented in FIG. 13, taken in only one direction, can likewise be increased.

Figure 14:
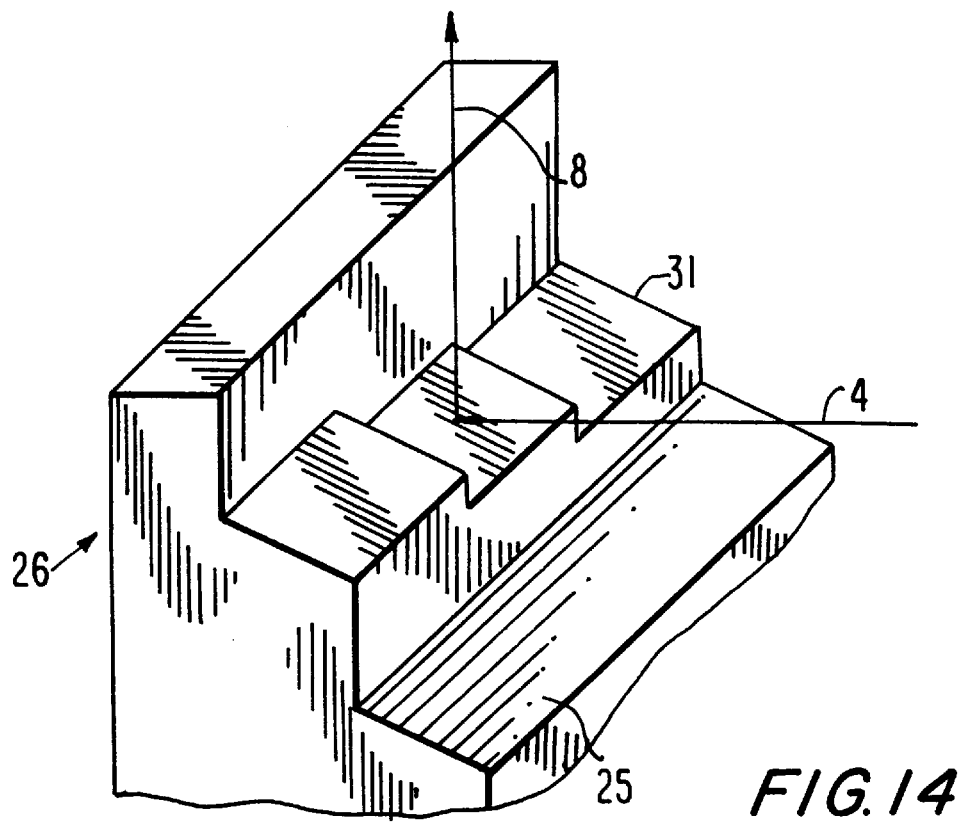
FIG. 14 shows the arrangement according to FIG. 13, wherein a linear laser field array is associated with the individual staircase mirror elements.

In FIG. 14, the upper part of the staircase mirror 26 of FIG. 13 is shown enlarged. While the individual reflective surfaces 25 of the staircase mirror 26 that are associated with each step in FIG. 13 lie in one plane, in the case of the embodiment in FIG. 14, one reflective surface is additionally staggered, so that in this manner the individual radiation fractions of a linear field arrangement 29 of individual radiation sources receive a corresponding stagger at the impingement side.

Figure 15:
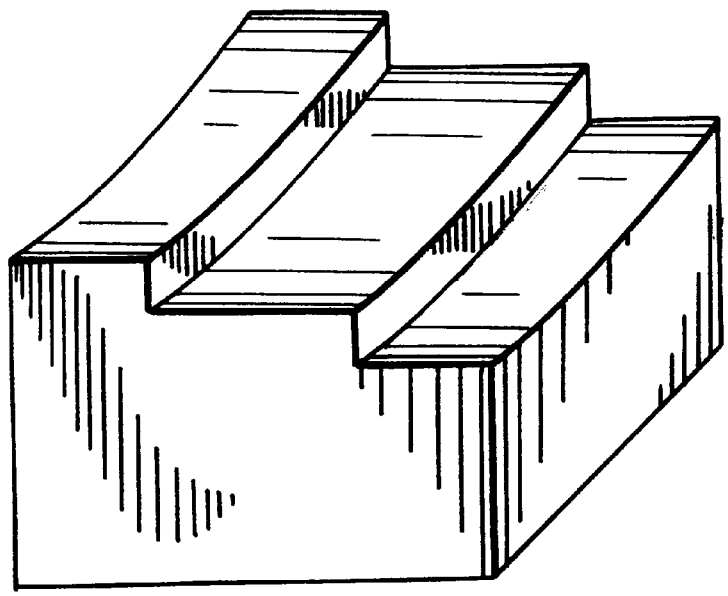
FIGS. 15 and 16 show each a staircase mirror with concavely curved mirror surfaces.
Figure 16:
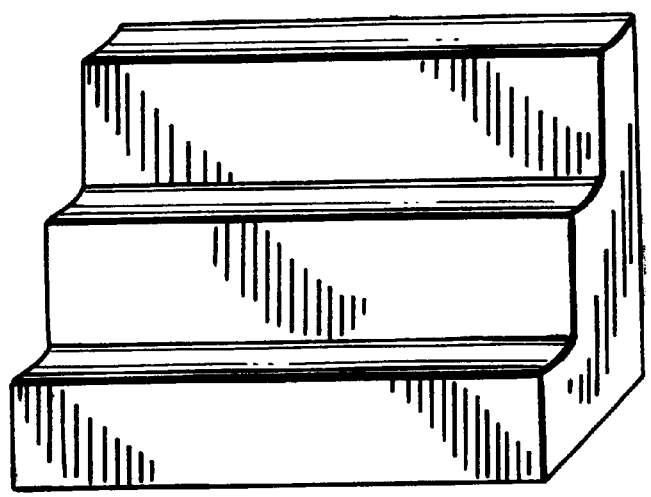

In order to additionally focus the individual radiation fractions which strike the refractive or reflective elements described above, the individual radiation entry surfaces of the refractive elements, or else the mirror surfaces of the reflective elements, can be made concave in different directions, preferably in sectors of a cylinder as shown in FIGS. 15 and 16.

Various embodiments have been explained above in order either to group and rearrange the individual radiation fractions, or else to increase the fill factor of a radiation group. It can be understood that the measures that have been set forth for regrouping and increasing the fill factor can be performed in different order and in a different number of steps.

Figure 17:
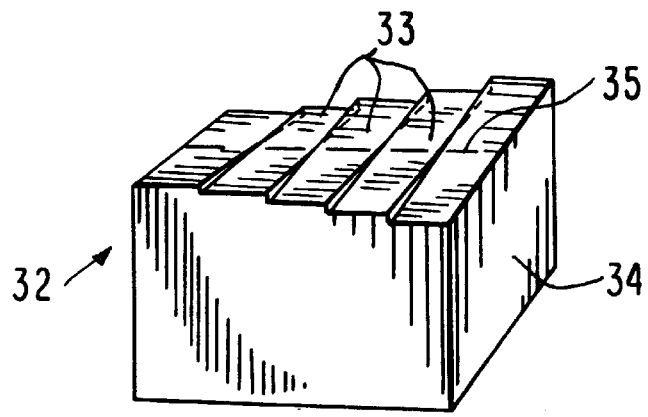
FIG. 17 shows a staircase mirror in which the individual mirror surfaces are rotated against one another by the same angle.

In FIG. 17 there is shown an additional embodiment of a staircase mirror 32 with six mirror surfaces 33, each mirror surface 33 being associated with a group of beams. The individual mirror surfaces 33 are on the one hand standing perpendicular on a plane which corresponds to the surface 34 of the staircase mirror 32, and on the other hand they are rotated about an axis 35 indicated by a broken line in FIG. 17, each by the same angle to the other. In this manner a double staggering or a two-fold transformation of the individual radiation fractions can be achieved between the entry side and the radiation exit side.

A refractive body corresponding to the staircase mirror 32 as represented in FIG. 17 can be made, and then the individual mirror surfaces 33 of the staircase mirror 32 of FIG. 17 will correspond to the entry and/or exit surfaces for the radiation groups.

Furthermore, in contrast to what is represented in FIG. 17, the individual mirror surfaces 33 can have an additional offset such that the individual axes 35 about which the individual mirror surfaces 33 are rotated are spaced apart and aligned parallel to one another.

Figure 18:
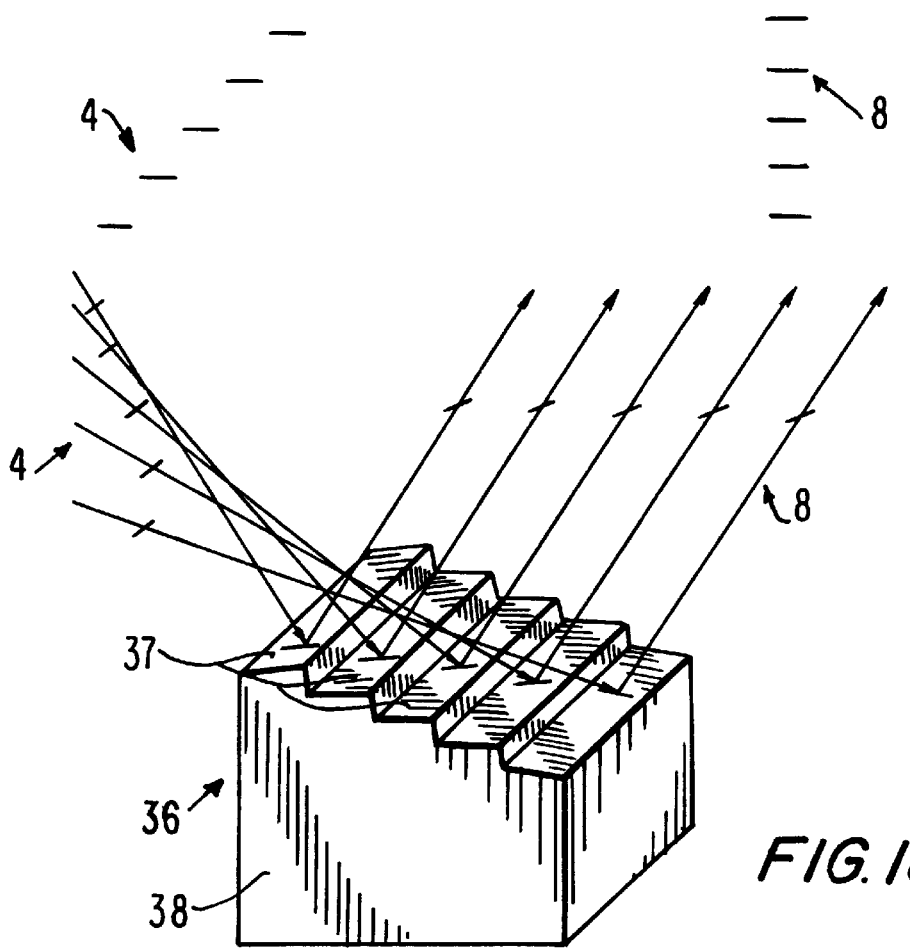
FIG. 18 shows another embodiment of a staircase mirror in which the individual mirror surfaces have a different offset from one another and are inclined differently from one another.

FIG. 18 shows an example of another staircase mirror 36 with six mirror surfaces 37 each associated with a radiation group. The individual staircase mirror surfaces 37 stand upright on a surface 38 which corresponds to the one lateral surface of the staircase mirror 36 in FIG. 18, but they are all slightly tilted across their length with respect to one another, the longitudinal edges which stand vertically on the surface 38 being aligned parallel to one another. The offset between adjacent mirror surfaces 37 increases from right to left. This brings it about that, starting with incoming radiation groups which are separated spatially and differ in their direction of propagation, they are reflected such that the radiation groups are stacked one over the other with respect to diode lasers in the fast direction and spread out in a common direction. This applies similarly to solid lasers.

Figure 19A:
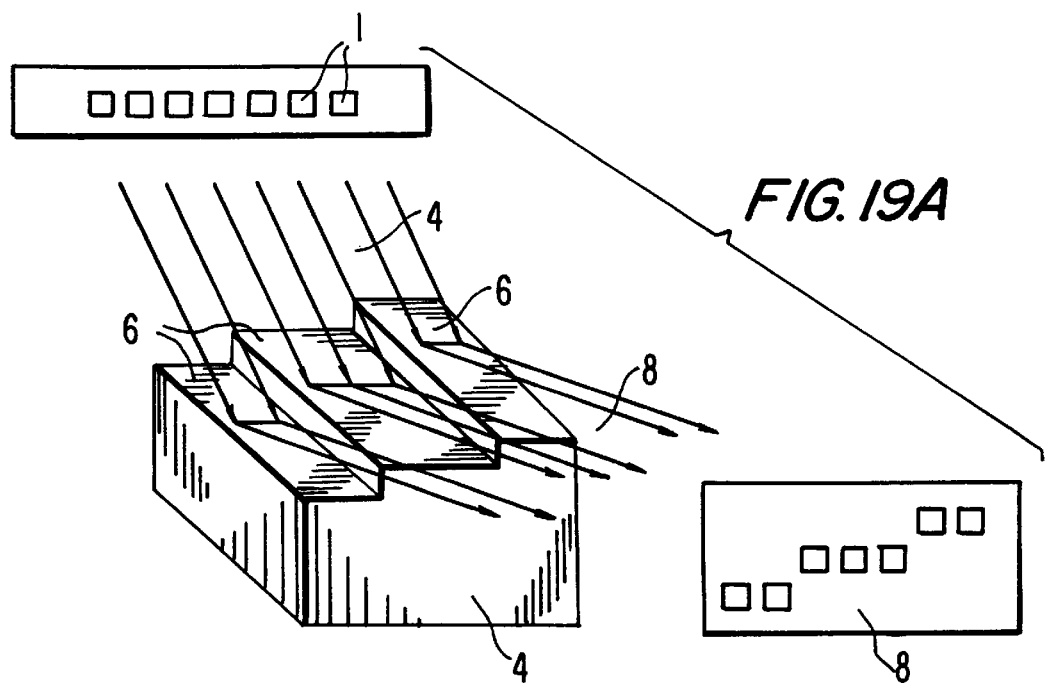
FIGS. 19A and 19B show a reflective element (FIG. 19A) and a refractive element (FIG. 19B), whereby the radiation field of a linear laser array is grouped in three parts and formed to an approximately round radiation field.
Figure 19B:
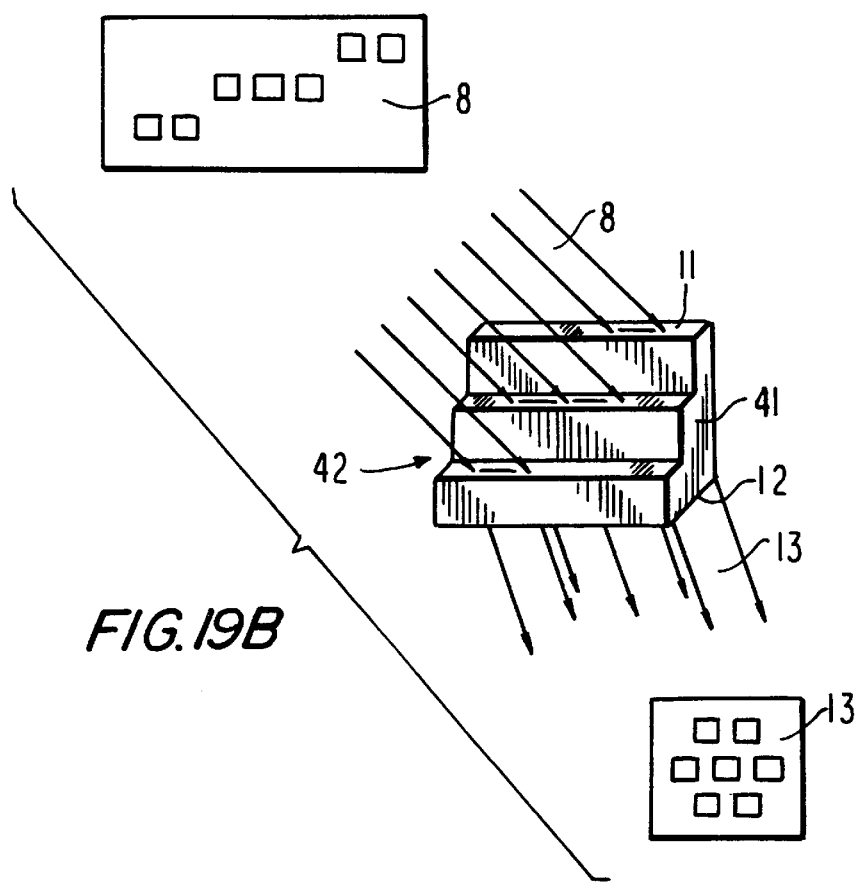

Another embodiment for grouping and reorientation of a radiation field emitted by seven linearly disposed, individual radiation sources, a single diode 1 for example, is represented in FIGS. 19A and 19B. In FIG. 19A the individual radiation fractions or groups 4, which are grouped according to the number of individual diodes, fall on a reflective body 40 which has three staggered reflecting surfaces 6. The radiation groups 4 are so grouped and associated with these reflecting surfaces 6 that two of the radiation fractions of the individual diodes 1 are reflected at the two outer reflecting surfaces 6, while the radiation fractions of the corresponding three middle diodes 1 of the linear field array enter at the middle reflecting surface 6. Due to the different spacing of the field array from the reflecting surfaces 6, the individual radiation fractions are staggered at the reflecting surface 6, so that a beam pattern is formed as indicated on the right in FIG. 19A. With this beam pattern, three refractive elements 41 of an element 42 are associated, corresponding to the three beam grouipings, as shown in FIG. 19B. The individual reflective elements 41 are offset such that the three beam groups are propagated along paths of different length such that they are offset at the beam exit surfaces 12 and are drawn together such that the result is an approximately circular radiation field with two-three-two radiation fields one under the other.

With this figure it can be seen that, by a deliberate reorientation of the individual radiation fields by the reflective and refractive measures the radiation of the individual diodes 1, or also the radiation of a field array of individual linear single beam sources, can be adapted to requirements.

Furthermore, it should be apparent that, on the basis of the reflections, a reorientation of the individual radiation fractions can take place, i.e., these radiation fractions can be rotated and reflected about the axis of their direction of propagation.

Figure 20:
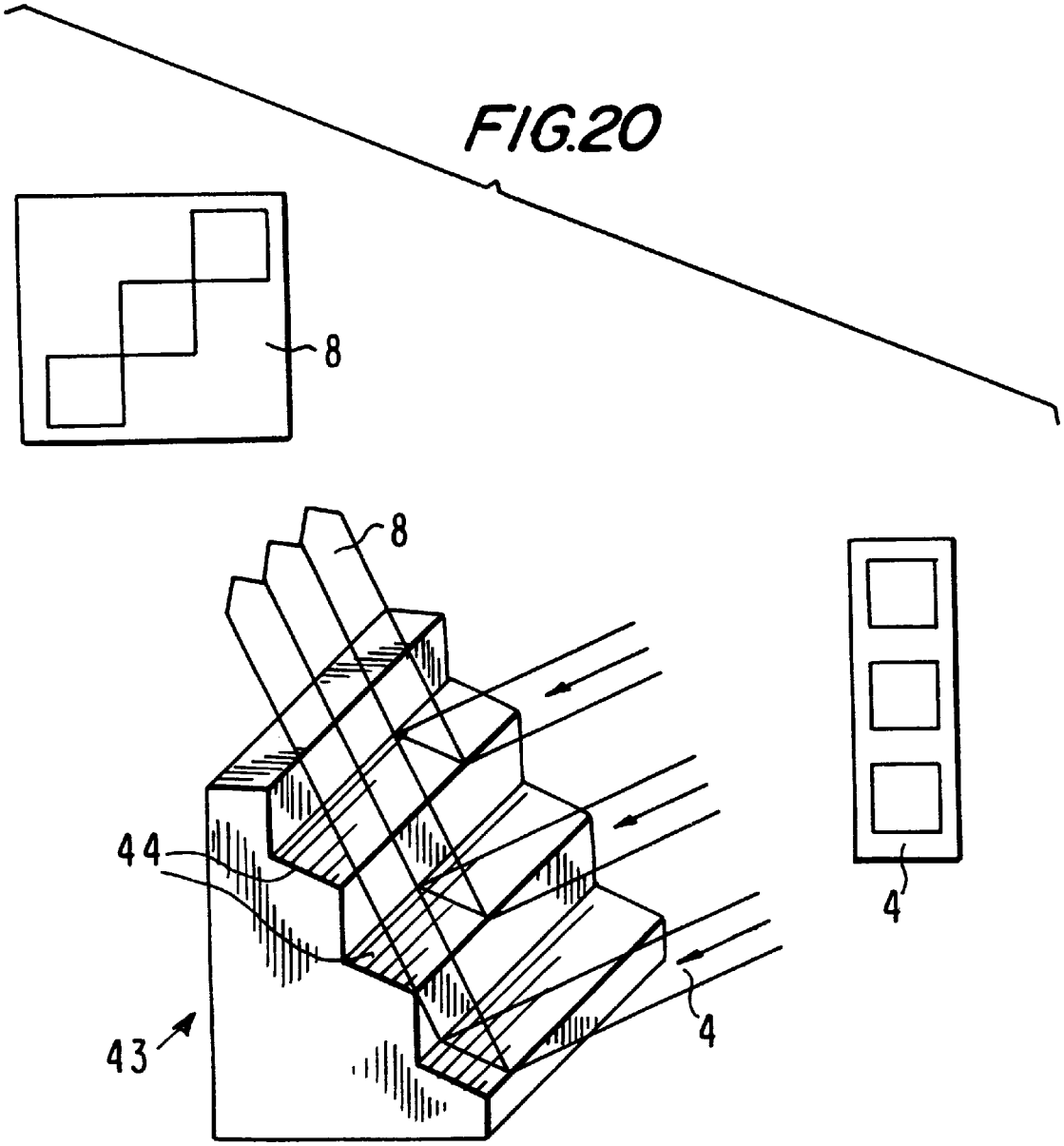
FIG. 20 shows schematically an additional staircase mirror with an additional exemplary grouping of the radiation fields.

FIG. 20 again shows an embodiment having a staircase mirror 43 which is comparable to the staircase mirror 26 of FIG. 12. In this example it is shown that by tilting the individual mirror surfaces 44 so that they have a sawtooth shape composed of a linear radiation field arrangement as represented on the right in FIG. 20, where the individual radiation cross sections of the individual radiation sources lie one under the other and are spaced apart from one another, a reorientation can take place such that these radiation cross section surfaces lie on a diagonal and adjoin one another, as shown on the upper left in FIG. 20. With this arrangement the fill factor on the exit side is increased in comparison with the entry side, but at the same time an offset is achieved.

What is claimed is:

1. Device for the formation and guidance of a radiation field from the group having at least one of a solid laser or semiconductor laser, with a radiation transforming optic for producing a defined radiation field, the optic having reflective elements, wherein the radiation field is grouped into at least two radiation fractions, that each radiation group is directed at a reflective element with a reflection surface and the reflection surfaces are arranged in planes which are at least offset or included with respect to one another such that the radiation groups are radiated from the reflection surfaces with lateral exit coordinates and exit propagation directions altered from their relative lateral entry coordinates on the reflective element, that reflected radiation groups are grouped and each radiation group enters into an associated refractive element while each refractive element refracts the radiation group at at least one of its surfaces such that the radiation groups exit from the refractive elements with lateral exit coordinates relatively modified with respect to their relative lateral entry coordinates and with different exit propagation directions.

2. Device according to claim 1, wherein the offset corresponds sequentially to the sequence of the radiation groups.

3. Device according to claim 1, wherein the reflection surfaces have each a different spacing from their associated radiation exit surfaces of the lasers.

4. Device according to claim 1, wherein the centers of the irradiated reflection surfaces lie on a straight line.

5. Device according to claim 1, wherein the offset and the particular change in spacing of adjacent reflection surfaces are of equal magnitude.

6. Device according to claim 1, wherein the reflection surfaces are formed by a mirror.

7. Device according to claim 1, wherein the reflection surfaces are planar surface areas.

8. Device according to claim 1, wherein the reflection surfaces are concavely or convexly curved surface areas.

9. Device according to claim 1, wherein the individual radiation groups pass each over differently long propagation paths to the refractive elements.

10. Device according to claim 9, wherein the entry surfaces or exit surfaces of the individual refractive elements stand perpendicular on a common plane and are inclined differently from one another.

11. Device according to claim 9, wherein directly adjacent radiation groups have the same differences in their propagation paths.

12. Device according to claim 1, wherein the exit surfaces of the refractive elements are offset in a staircase-like manner from one another.

13. Device according to claim 12, wherein the individual reflective elements are rotated from one another about a common axis running in the plane of these surfaces.

14. Device according to claim 12, wherein the entry surfaces and/or exit surfaces of the individual refractive elements are rotated from one another about a common axis that runs in the plane of these surfaces.

15. Device according to claim 1, wherein the exit surfaces or entry surfaces of the refractive elements are in planes running parallel to one another.

16. Device according to claim 1, wherein the radiation groups enter into respective entry surfaces of the refractive elements which lie in a plane.

17. Device according to claim 1, wherein at least some of the refractive elements have refractive indices different from one another.

18. Device according to claim 17, wherein adjacent refractive elements have different refraction indices.

19. Device according to claim 17, wherein individual adjacent refractive elements are separated from one another by a layer which has a lower refractive index than the adjacent refractive element.

20. Device according to claims 9, 11, 12, 15, 16, 17, 18, or 19, wherein the individual reflective elements stand vertically on the common plane and are inclined differently from one another.

21. Device according to claim 1, wherein the refractive elements are formed of a vitreous material.

22. Device according to claim 1, wherein the refractive elements form a one-piece body.

23. Device according to claim 1, wherein radiation groups whose cross-sectional dimensions of their radiation fractions are less than the width of the associated reflective element, the particular radiation groups strikes the reflection surface of the particular reflective element at an angle of incidence unequal to 0 degrees such that approximately the entire width of the reflection surface of the reflective element is illuminated.

24. Device according to claim 1, wherein radiation groups whose cross-sectional dimensions of their radiation fractions are less than the width of the associated refractive element the particular radiation group enters into the entry surface of the particular refractive element at an angle of incidence unequal to 0 degrees such that approximately the entire width of the entry surface of the refractive element is illuminated.

25. Device according to claim 1, wherein the radiation groups associated with the reflective or refractive elements form a strip-like radiation field wherein the radiation groups of each strip-like radiation field, lying in a plane parallel to one another, are aligned transversely of the direction of propagation of the radiation.

26. Device according to claim 25, wherein a plurality of strip-like radiation fields are disposed parallel to one another.

27. Device according to claim 25, wherein the strip-like radiation fields are at an equal distance apart.

28. Device according to claim 25, wherein each strip-like radiation field is formed of an equal number of radiation groups.

29. Process for the formation and guidance of a radiation field at least one solid lasers, with a radiation transforming optic for producing a defined radiation field, the optic having reflective elements, characterized in that the radiation field is grouped into at least two radiation fractions, that each formed radiation group is directed at a reflective element with a reflection surface, wherein the radiation fractions are reflected by the reflection surfaces, which are arranged in planes and are offset from one another, in directions such that they are given an offset in a first direction perpendicular to the direction of propagation, that reflected radiation groups are grouped, and each radiation group is projected into a refractive element associated with it, while in each refractive element the radiation group is refracted at at least one of its surfaces such that the radiation groups exiting from the refractive elements emerge offset from one another in a second direction compared to the direction of the radiation groups projected into a refractive element.

30. Process according to claim 29, wherein the radiation fractions are transformed such that the radiation groups exiting from the last element have a common point of intersection.

31. Process according to claim 29, wherein the radiation groups are reflected by the reflective elements in a direction which has an important direction component perpendicular to the greatest length of the field arrangement or radiation field.

32. Process according to claim 29, wherein the radiation fractions are transformed such that the radiation groups issuing from the last element have propagation directions parallel to one another.

33. Process according to claim 29, wherein the radiation fractions are transformed such that the radiation groups issuing from the last element have a common point of intersection.

34. Device for the formation and guidance of a radiation field from the group having at least one solid of a laser or semiconductor laser, with a radiation transforming optic for producing a defined radiation field, the optic having reflective elements, wherein the radiation field is grouped into at least two radiation fractions, that each radiation group is directed at a reflective element with a reflection surface and the reflection surfaces are arranged in planes which are at least offset or inclined with respect to one another such that the radiation groups are radiated from the reflection surfaces with lateral exit coordinates altered from their relative lateral entry coordinates on the reflective element, that reflected radiation groups are grouped and each radiation group enters into an associated refractive element while each refractive element refracts the radiation group at at least one of its surfaces such that the radiation groups exit from the refractive elements with lateral exit coordinates relatively modified with respect to their relative lateral entry coordinates and with different exit propagation directions.

35. Device for the formation and guidance of a radiation field from the group having at least one of a solid laser or semiconductor laser, with a radiation transforming optic for producing a defined radiation field, the optic having reflective elements, wherein the radiation field is grouped into at least two radiation fractions, that each radiation group is directed at a reflective element with a reflection surface and the reflection surfaces are arranged in planes which are at least offset or inclined with respect to one another such that the radiation groups are radiated from the reflection surfaces with lateral exit coordinates altered from their relative lateral entry coordinates on the reflective element, that reflected radiation groups are grouped and each radiation group enters into an associated refractive element while each refractive element refracts the radiation group at at least one of its surfaces such that the radiation groups exit from the refractive elements with lateral exit coordinates relatively modified with respect to their relative lateral entry coordinates.

36. Device for the formation and guidance of a radiation field from the group having at least one solid of a laser or semiconductor laser, with a radiation transforming optic for producing a defined radiation field, the optic having reflective elements, wherein the radiation field is grouped into at least two radiation fractions, that each radiation group is directed at a reflective element with a reflection surface and the reflection surfaces are arranged in planes which are at least offset or inclined with respect to one another such that the radiation groups are radiated from the reflection surfaces with lateral exit coordinates altered from their relative lateral entry coordinates on the reflective element, that reflected radiation groups are grouped and each radiation group enters into an associated refractive element while each refractive element refracts the radiation group at at least one of its surfaces such that the radiation groups exit from the refractive element with lateral exit coordinates relatively modified with different exit propagation directions.

37. Device for the formation and guidance of a radiation field from the group having at least one of a solid laser or semiconductor laser, with a radiation transforming optic for producing a defined radiation field, the optic having reflective elements, wherein the radiation field is grouped into at least two radiation fractions, that each radiation group is directed at a reflective element with a reflection surface and the reflection surfaces are arranged in planes which are at least offset or inclined with respect to one another such that the radiation groups are radiated from the reflection surfaces with exit propagation directions altered from their relative lateral entry coordinates on the reflective element, that reflected radiation groups are grouped and each radiation group enters into an associated refractive element while each refractive element refracts the radiation group at at least one of its surfaces such that the radiation groups exit from the refractive elements with lateral exit coordinates relatively modified with respect to their relative lateral entry coordinates and with different exit propagation directions.

38. Device for the formation and guidance of a radiation field from the group having at least one solid of a laser or semiconductor laser, with a radiation transforming optic for producing a defined radiation field, the optic having reflective elements, wherein the radiation field is grouped into at least two radiation fractions, that each radiation group is directed at a reflective element with a reflection surface and the reflection surfaces are arranged in planes which are at least offset or inclined with respect to one another such that the radiation groups are radiated from the reflection surfaces with exit propagation directions altered from their relative lateral entry coordinates on the reflective element, that reflected radiation groups are grouped and each radiation group enters into an associated refractive element while each refractive element refracts the radiation group at at least one of its surfaces such that the radiation groups exit from the refractive elements with lateral exit coordinates relatively modified with respect to their relative lateral entry coordinates.

39. Device for the formation and guidance of a radiation field from the group having at least one of a solid laser or semiconductor laser, with a radiation transforming optic for producing a defined radiation field, the optic having reflective elements, wherein the radiation field is grouped into at least two radiation fractions, that each radiation group is directed at a reflective element with a reflection surface and the reflection surfaces are arranged in planes which are at least offset or inclined with respect to one another such that the radiation groups are radiated from the reflection surfaces with exit propagation directions altered from their relative lateral entry coordinates on the reflective element, that reflected radiation groups are grouped and each radiation group enters into an associated refractive element while each refractive element refracts the radiation group at at least one of its surfaces such that the radiation groups exit from the refractive elements with lateral exit coordinates relatively modified with different exit propagation directions.

40. Device for the formation and guidance of a radiation field from the group having at least one of a solid laser or semiconductor laser, with a radiation transforming optic for producing a defined radiation field, the optic having reflective element, wherein the radiation field is grouped into at least two radiation fractions, that each radiation group is directed at a reflective element with a reflection surface and the reflection surfaces are arranged in planes which are at least offset or inclined with respect to one another such that the radiation groups are radiated from the reflection surfaces with lateral exit coordinates and exit propagation directions altered from their relative lateral entry coordinates on the reflective element, that reflected radiation groups are grouped and each radiation group enters into an associated refractive element while each refractive element refracts the radiation group at at least one of its surfaces such that the radiation groups exit from the refractive elements with lateral exit coordinates relatively modified with different exit propagation directions.

41. Device for the formation and guidance of a radiation field from the group having at least one of a solid laser or semiconductor laser, with a radiation transforming optic for producing a defined radiation field, the optic having reflective elements, wherein the radiation field is grouped into at least two radiation fractions, that each radiation group is directed at a reflective element with a reflection surface and the reflection surfaces are arranged in planes which are at least offset or inclined with respect to one another such that the radiation groups are radiated from the reflection surfaces with lateral exit coordinates and exit propagation directions altered from their relative lateral entry coordinates on the reflective element, that reflected radiation groups are grouped and each radiation group enters into an associated refractive element while each refractive element refracts the radiation group at at least one of its surfaces such that the radiation groups exit from the refractive elements with lateral exit coordinates relatively modified with respect to their relative lateral entry.

* * * * *